United States Patent
Shibata et al.

[11] Patent Number: 6,147,451
[45] Date of Patent: Nov. 14, 2000

[54] ORGANIC ELECTROMINISCENT DISPLAY DEVICE

[75] Inventors: Kenichi Shibata, Hashimoto; Yuji Hamada, Nara, both of Japan

[73] Assignee: Sanyo Electric Co., Ltd., Osaka, Japan

[21] Appl. No.: 09/129,837

[22] Filed: Aug. 6, 1998

[30] Foreign Application Priority Data

Aug. 8, 1997 [JP] Japan ................................. 9-214724

[51] Int. Cl.⁷ ................................ G09F 9/30; H01J 1/62
[52] U.S. Cl. ........................ 313/506; 315/169.3; 345/80
[58] Field of Search ................................ 313/506, 505; 315/169.3; 345/80

[56] References Cited

U.S. PATENT DOCUMENTS 5,550,066  8/1996  Tang et al. .
5,602,445  2/1997  Solanki et al. ................. 313/506 X
5,612,591  3/1997  Katayama et al. .............. 313/506 X

OTHER PUBLICATIONS

Patent Abstracts of Japan, Publication No. 09114398A, May 2, 1997.

*Primary Examiner*—Ashok Patel
*Attorney, Agent, or Firm*—Arent Fox Kitner Plotkin & Kahn PLLC

[57] ABSTRACT

The present invention has an object to produce a pixel array comprising an organic EL device and a peripheral driving circuit on the same substrate, to facilitate the fabrication of an organic EL display device and miniaturize the display device.

In the organic EL display device according to the present invention, a pixel array 2 composed of an organic EL device is provided on a semiconductor substrate 1, a driving integrated circuit 3 for driving the organic EL device is formed in the periphery of the pixel array 2 on the semiconductor substrate 1, and the pixel array 2 and the driving integrated circuit 3 are integrated.

9 Claims, 6 Drawing Sheets

ORGANIC ELECTROMINISCENT DISPLAY DEVICE

BACKGROUND OF THE INVENTION

1. Field of the Invention

The present invention relates to an organic electroluminescent display device using an organic electroluminescent device (hereinafter referred to as an organic EL device) as a light emitting device.

2. Description of the Prior Art

An organic EL device has been expected as a new self light emitting device. Examples of the structure of the organic EL device include generally a structure (an SH-A structure) in which a hole transporting layer and a light emitting layer are formed between a hole injection electrode serving as an anode and an electron injection electrode serving as a cathode, a two-layer structure (an SH-B structure) in which a light emitting layer and an electron transporting layer are formed between a hole injection electrode and an electron injection electrode, and a three-layer structure (a DH structure) in which a hole transporting layer, a light emitting layer and an electron transporting layer are formed between a hole injection electrode and an electron injection electrode.

An electrode material having a large work function, for example, gold or ITO (an indium-tin oxide) is used as the hole injection electrode serving as an anode, while an electrode material having a small work function, for example, Mg is used as the electron injection electrode serving as a cathode.

Organic materials are used for the hole transporting layer, the light emitting layer and the electron transporting layer. A material having the property of a p-type semiconductor and a material having the property of an n-type semiconductor are respectively used for the hole transporting layer and the electron transporting layer. For the light emitting layer, a material having the property of an n-type semiconductor, a material having the property of a p-type semiconductor, and a material having the property close to neutrality are respectively used in the SH-A structure, the SH-B structure, and the DH structure.

In any of the structures, the organic EL device emits light upon recombination of holes injected from the hole injection electrode (the anode) and electrons injected from the electron injection electrode (the cathode) in the interface between the light emitting layer and the hole (or electron) transporting layer and in the light emitting layer. Consequently, the organic EL device can emit light at a lower voltage, which is very hopeful as a future display device, as compared with an inorganic EL device having a collision excitation type light emitting mechanism as its light emitting mechanism.

A display device using this type of organic EL device is disclosed in U.S. Pat. No. 5,550,066. The organic EL display device uses a thin film transistor (TFT) provided on a glass substrate as an active matrix driving device, and the organic EL device is formed in an array shape on the glass substrate.

In the above-mentioned conventional organic EL display device, an island composed of polycrystalline silicon is formed on the glass substrate, and the active matrix driving device composed of the TFT is formed on the island. In the above-mentioned display device, however, it is necessary to separately prepare a peripheral driving integrated circuit (IC), including a shift register and a latch circuit, for driving the active matrix driving device, and connect a driving device of the organic EL device formed on the glass substrate and the peripheral driving integrated circuit by wires or flat cables using a mounting technique. Therefore, the fabrication of the display device is troublesome, and the size thereof is increased.

On the other hand, JP-A-09-114398 (Int.cl.G09F 9/30) discloses an organic EL display device in which a monocrystalline silicon semiconductor substrate is used as a substrate, an active matrix driving device is constituted by a MOS transistor composed of monocrystalline silicone, and an organic EL device is formed in an array shape on the semiconductor substrate. In the organic EL display device, the monocrystalline silicone semiconductor substrate is used as a substrate, so that a peripheral driving integrated circuit is easy to incorporate, thereby making it possible to eliminate the necessity of externally providing the driving integrated circuit.

However, the above-mentioned organic EL display device is so constructed that the organic EL device emits light from its surface on the side of a silicone substrate, so that a portion, corresponding to a light emitting portion of the organic EL device, of the substrate is subjected to etching, to form a light transmitting portion. Therefore, the number of etching steps for forming the light transmitting portion is increased. Further, the mechanical strength of the display device is significantly weakened because the substrate is thinned by etching, to form the light transmitting portion such that the organic EL device emits light.

SUMMARY OF THE INVENTION

The present invention has been made in order to solve the above-mentioned conventional problems, and has an object to produce a pixel array comprising an organic EL device and a peripheral driving circuit on the same substrate, to facilitate the fabrication of an organic EL display device and miniaturize the display device.

An organic EL display device according to the present invention is characterized in that a pixel array composed of an organic. EL device is provided on a semiconductor base substrate, a driving integrated circuit for driving the organic EL device is formed in the periphery of the pixel array on the semiconductor base substrate, and a cathode, an organic layer and an anode are laminated in this order on the semiconductor base substrate, so that the organic EL device emits light from its surface on the opposite side of the base substrate.

As described above, the pixel array comprising the organic EL device and the driving integrated circuit are produced on the same substrate, thereby facilitating the fabrication of the organic EL display device and miniaturizing the display device. Further, the organic EL device emits light from its surface on the opposite side of the base substrate.

A semiconductor base substrate having an island composed of a polycrystalline silicon semiconductor provided on its insulating substrate can be used as the above-mentioned semiconductor base substrate.

The area of the display device can be easily increased by using the above-mentioned base substrate.

An organic EL display device according to the present invention is characterized in that a pixel array composed of an organic EL device is provided on an insulating substrate, an island having a polycrystalline silicon semiconductor formed thereon in a predetermined pattern is provided on the substrate, and a thin film transistor formed in the island is used as a pixel driving device and a peripheral driving circuit device.

The organic EL display device may be so constructed that a cathode, an organic layer and an anode are laminated in this order on the substrate, so that the organic EL device emits light from its surface on the opposite side of the substrate.

A transparent substrate can be used as the above-mentioned substrate. The organic EL display device can be so constructed that an anode, an organic layer and a cathode are laminated in this order on the substrate, so that the organic EL device emits light from its surface on the side of the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

An embodiment of an organic EL display device according to the present invention will be described with reference to the drawings.

Figure 1:
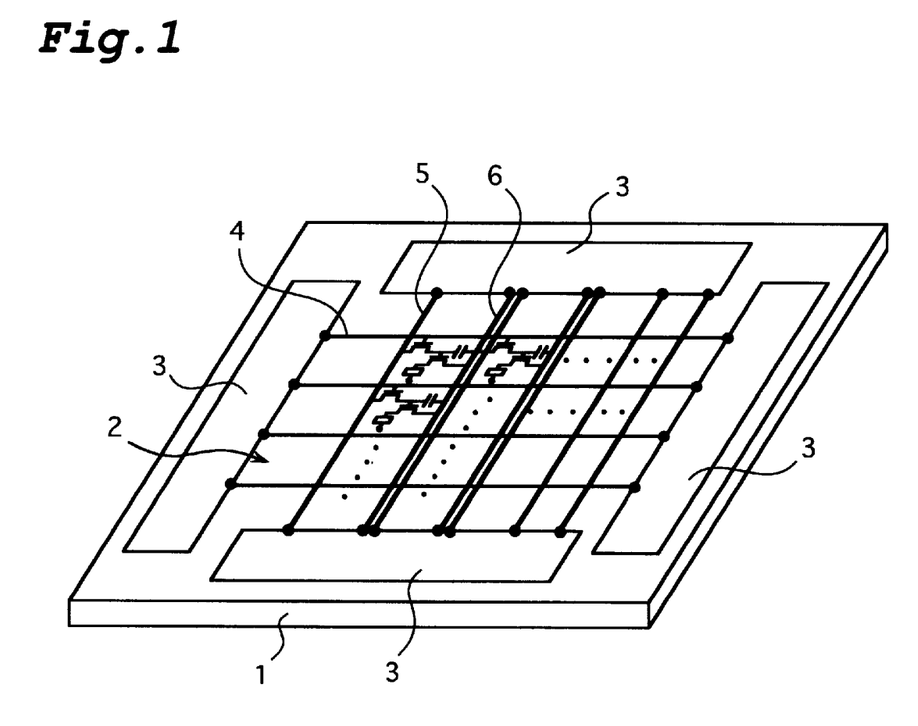
FIG. 1 is a schematic view of a driving circuit integrated type organic EL display device in an active and static driving system in a first embodiment of the present invention.
Figure 2:
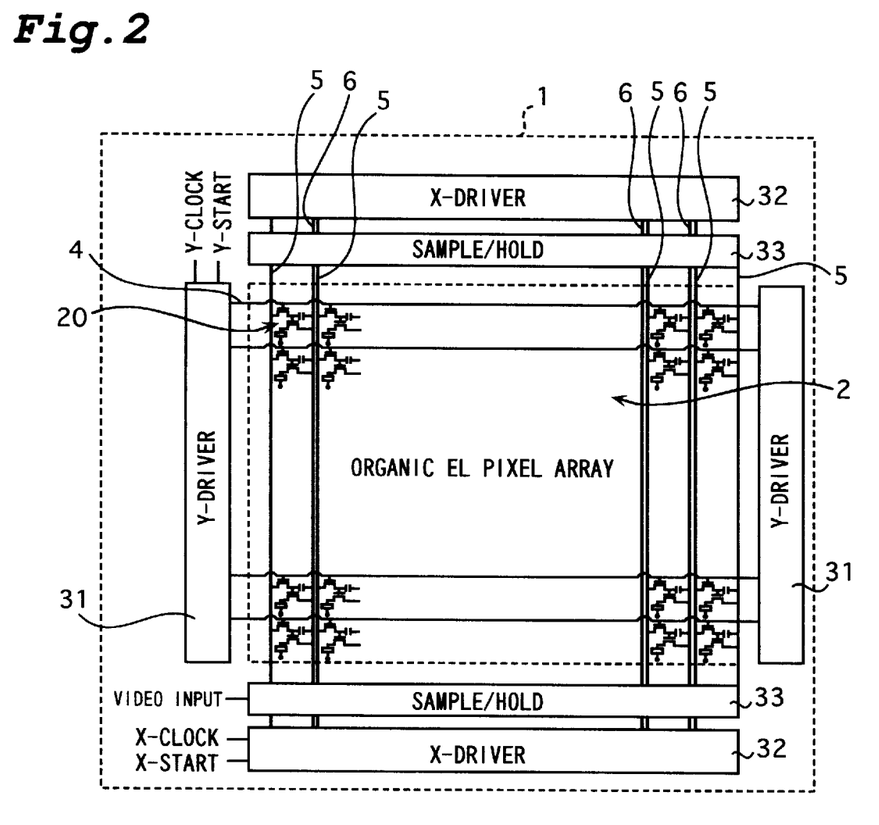
FIG. 2 is a diagram showing the schematic circuit structure in the first embodiment of the present invention.

As shown in FIGS. 1 and 2, in the first embodiment, a polycrystalline silicon semiconductor substrate is used as a substrate 1, and a pixel array 2 composed of an organic EL device and a peripheral driving integrated circuit 3 are formed on the substrate 1.

The peripheral driving integrated circuit 3 comprises a Y driver 31 for feeding a scanning signal for displaying an image signal or the like on a screen to row selecting lines 4, an X driver 32 for feeding a data signal to data lines 5, and a sample/hold circuit 33 for sampling and holding video input signal data in accordance with a clock signal from the X driver 32.

As described in the foregoing, the substrate 1 is a monocrystalline silicon semiconductor substrate, and the Y driver 31, the X driver 32, and the sample/hold circuit 33 are formed in the periphery of the pixel array 2 by a known CMOS process. A Y clock and a Y start signal are fed to the Y driver 31, an X clock and an X start signal are fed to the X driver 32, and a video signal is fed to the sample/hold circuit 33.

Figure 3:
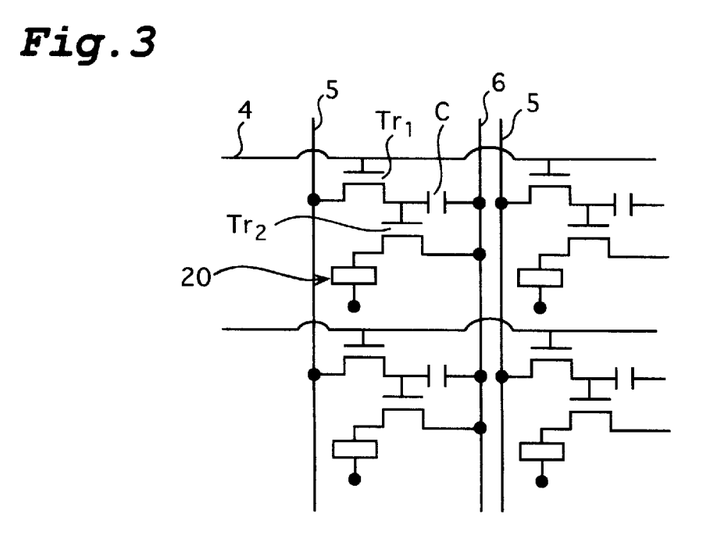
FIG. 3 is a diagram showing an equivalent circuit of an organic EL device in the first embodiment of the present invention.
Figure 4:
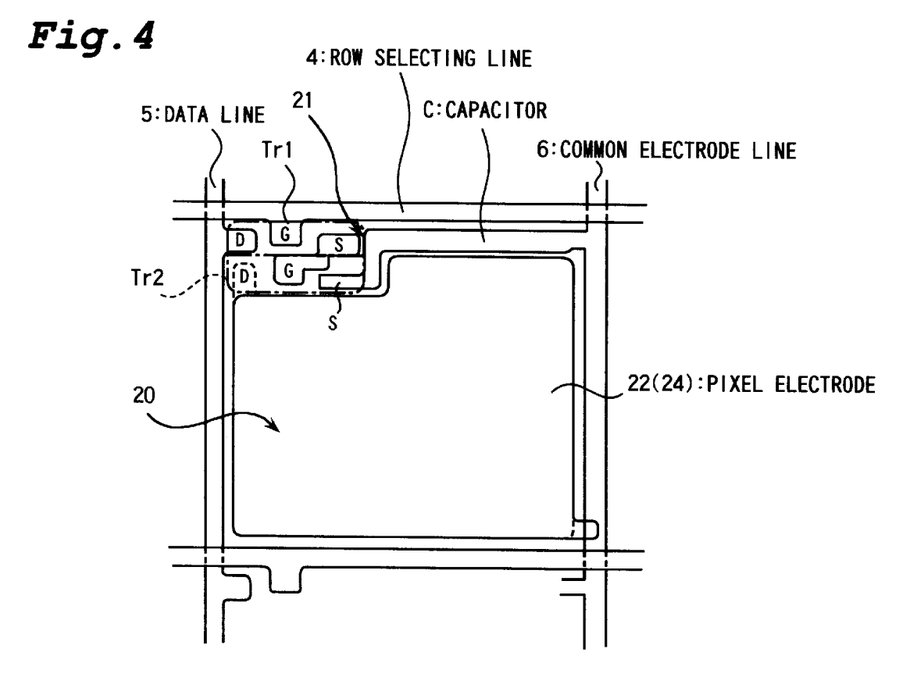
FIG. 4 is a plan view showing the organic EL device in the first embodiment of the present invention.

In the pixel array 2 in the semiconductor substrate 1, the row selecting lines 4 to which the horizontal scanning signal from the Y driver 31 is inputted are arranged parallel to each other through an insulating film on the substrate 1. The data lines 5 to which the data signal is fed are arranged similarly through the insulating film on the substrate 1. Further, common electrode lines 6 are arranged parallel to each other through the insulating film on the substrate 1. As shown in FIGS. 3 and 4, a portion enclosed by the row selecting line 4, the data line 5, and the common electrode line 6 is an organic EL device 20 corresponding to one pixel.

When the number of pixels (organic EL devices) in two-dimensional arrangement is n×m, the number of row selecting lines 4 and the number of common electrode lines 6 is n, and the number of data lines 5 is m.

The organic EL device 20 is provided with switching means 21 for turning the organic EL device on and off. The switching means 21 comprises two MOS transistors (T1) and (Tr2) each having source and drain diffusion layers provided on the semiconductor substrate 1 and a capacitor (C).

The MOS transistor (Tr1) has its gate (G) connected to the row selecting line 4, and has its drain (D) connected to the data line 5. The MOS transistor (Tr1) has its source (S) connected to the common electrode line 6 through the capacitor (C).

Furthermore, the MOS transistor (Tr2) has its gate (G) connected to the source (S) of the MOS transistor (Tr1), and has its source (S) connected to the common electrode line 6. The MOS transistor (Tr2) has its drain (D) connected to one of pixel electrodes, that is, an anode (a transparent electrode) 24 in the present embodiment, and the other pixel electrode (a cathode) 22 is connected to the common electrode line 6.

The MOS transistors (Tr1) and (Tr2) and the capacitor (C) are provided for each pixel.

Figure 5:
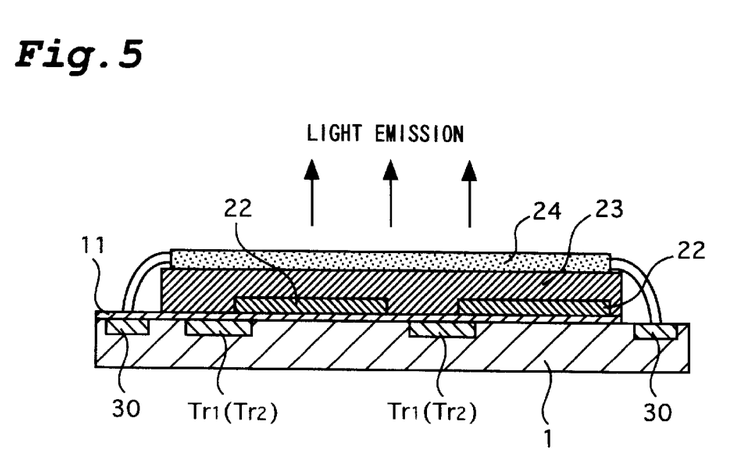
FIG. 5 is a schematic cross-sectional view showing the first embodiment of the present invention.
Figure 6:
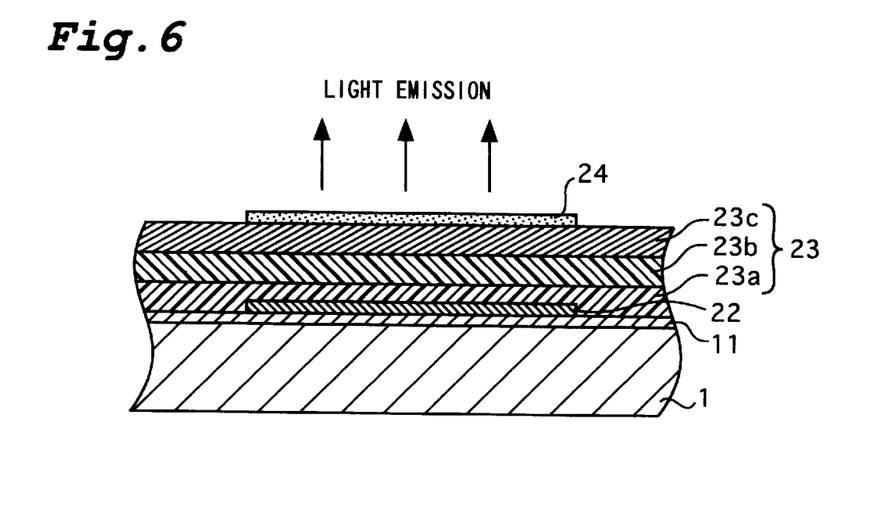
FIG. 6 is a cross-sectional view showing the organic EL device in the first embodiment of the present invention.

In the first embodiment, the cathode 22 is arranged on the side of the semiconductor substrate 1, and an organic layer 23, and the transparent electrode 24, composed of ITO, $SnO_2$, etc., serving as the anode are arranged thereon, so that the organic EL device 20 emits light from its surface opposite to the substrate 1, as shown in FIGS. 5 and 6. In the first embodiment, the organic EL device 20 emits light from its surface opposite to the substrate 1. Therefore, a light transmitting portion need not be formed by etching, for example, the substrate 1, the number of steps is not increased, and the mechanical strength may not be decreased.

The organic EL device will be described with reference to FIGS. 5 and 6. In the organic EL device according to the present invention, an insulating film 11 is formed on the silicon semiconductor substrate 1, and an electron injection electrode 22 (2000 Å in thickness) serving as the cathode, an electron transporting layer 23a (500 Å in thickness), a light emitting layer 23b (200 Å in thickness), a hole transporting layer 23c (500 Å in thickness), and a hole injection electrode 24, composed of an indium-tin oxide (ITO), serving as the anode are formed in this order on the insulating film 11. As described above, a deposited organic EL device is sealed using a sealing material and shield glass.

The electron injection electrode (the cathode) 22 uses a metal having a small work function, for example, MgIn, MgAg, or AlLi. However, the cathode 22 easily reacts with oxygen or water in air because it has a small work function. If the cathode is arranged on the uppermost layer of the organic EL device, an antioxidant film for preventing the cathode from being oxidized is required. On the other hand, in the present invention, the cathode 22 which is easily oxidized is provided on the substrate 1, and the organic layer 23 and the anode (the transparent electrode) 24 are arranged thereon. Therefore, the cathode 22 can be prevented from being oxidized even if no special antioxidant film is provided by sealing the organic EL device using a sealing material and shield glass.

The hole transporting layer 23c, the light emitting layer 23b, and the electron transporting layer 23a respectively use organic EL materials. As specific examples, the hole transporting layer 23c is composed of a triphenyl amine derivative (MTDATA) indicated by the following chemical formula 1, the light emitting layer 23b is composed of a material having as its host material N,N'-Diphenyl-N,N'-di(α-naphthyl)benzidine (αNPD) indicated by the following chemical formula 2 and having rubrene indicated by the following chemical formula 3 doped into the host material, and the electron transporting layer 23a is composed of a 10-benzo(h)-quinolinolberyllium (BeBq$_2$) complex indicated by the following chemical formula 4.

[1]

MTDATA

[2]

αNPD

[3]

rubrene

[4]

BeBq$_2$

Description is now made of an example of a method of fabricating the organic EL device having the structure shown in FIGS. 1 to 6.

MOS transistors to be a peripheral driving integrated circuit 3 and switching means 21 in each of organic EL devices 20 in an organic EL pixel array 2 are respectively formed on a semiconductor substrate 1 using a normal MOS-LSI process technique. The peripheral driving integrated circuit 3 and the switching means 21 of the pixel are formed by the MOS-LSI process. Row selecting lines 4, data lines 5, and common electrode lines 6 are also provided on the substrate 1 through an insulating film 11, and are connected to the peripheral driving integrated circuit 3 and the switching means 21. After the process, the organic EL device 20 is formed in the organic EL pixel array 2.

Cathodes 22 of the organic EL device 20 are first formed on the insulating film 11 on the semiconductor substrate 1. The cathodes 22 are formed, using a metal mask, in a predetermined pixel region on the semiconductor substrate 1 by resistance heating type vacuum evaporation. A material having a low work function, for example, MgIn, MgAg or AlLi is used as a material for the cathodes 22. Further, the pattern of the cathodes 22 is formed such that the common electrode line 6 and each of the cathodes 22 are electrically connected to each other.

Thereafter, an organic electron transporting layer 23a, an organic light emitting layer 23b, and an organic hole transporting layer 23c are successively formed in this order similarly using vacuum evaporation on the entire surface of the substrate 1, including the cathodes 22, by masking the driving integrated circuit 3 and the switching means 21. That is, BeBq$_2$ is vacuum-evaporated over the cathodes 22, to form the electron transporting layer 23a, αNPD and rubrene are evaporated over the electron transporting layer 23a, to form the light emitting layer 23b, after which MTDATA is vacuum-evaporated over the light emitting layer 23b, to form the hole transporting layer 23c. The evaporation is performed under conditions that the degree of vacuum is $1 \times 10^{-6}$ Torr and the substrate temperature is not controlled.

Transparent electrodes 24, composed of ITO, serving as anodes are formed in a predetermined pattern on an organic layer 23 by sputtering using a metal mask.

The wiring steps using an aluminum film for connecting the organic EL device 20 and the driving integrated circuit 3 are then carried out. By the wiring steps, the driving integrated circuit 3 and the organic EL device 20 are electrically connected to each other, and are also connected to the transparent electrodes 24 and the switching means 21. After the organic EL device 20 is formed, the organic layer 23 dissolves in a resist liquid, so that aluminum wiring is done in a predetermined pattern using a metal mask.

Thereafter, a protective film is formed on the entire surface of the organic EL pixel array 2 and the driving integrated circuit 3. Examples of a material for the protective film include a polymeric material (SiO), and metal oxides such as $SiO_2$ and MgO. After the protective film is formed, a display panel is sealed by shield glass and a sealing material, thereby obtaining a device in which the driving integrated circuit 3 and the organic EL pixel array 2 are integrated.

Figure 7:
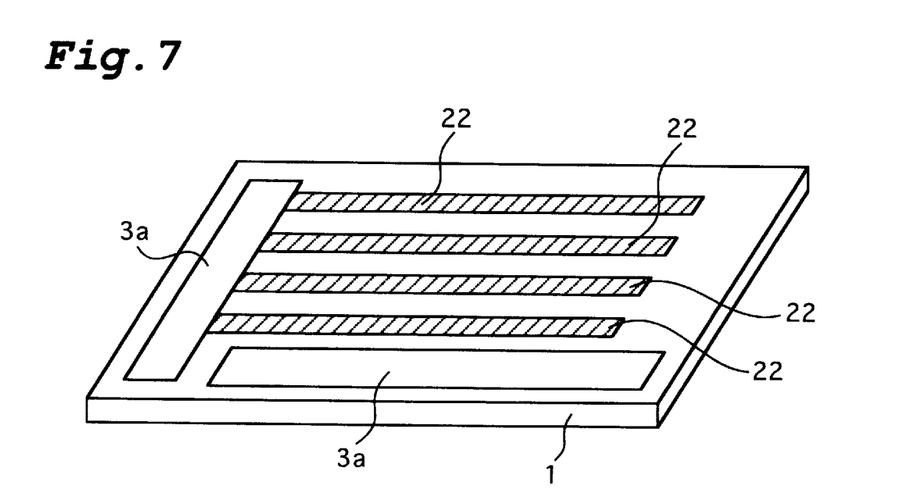
FIG. 7 is a schematic view of a driving circuit integrated type organic EL display device in a passive and dynamic driving system in a second embodiment of the present invention.
Figure 8:
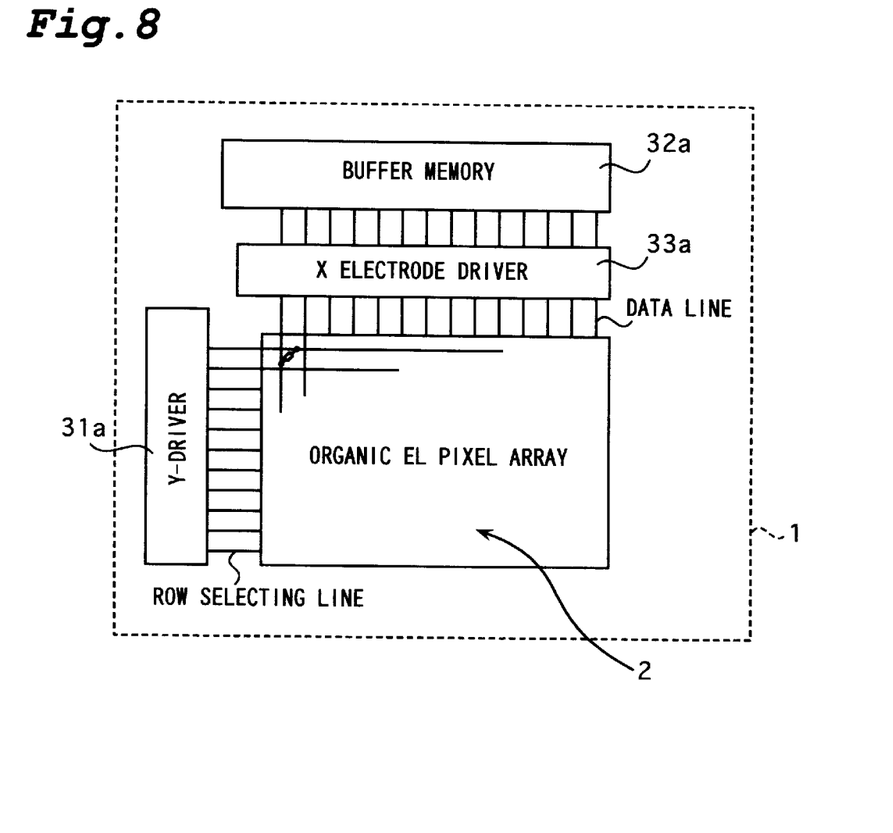
FIG. 8 is a diagram showing the schematic circuit structure in the second embodiment of the present invention.

FIG. 7 illustrates a second embodiment of an organic EL display device according to the present invention, which is a schematic view of a driving circuit integrated type organic EL display device in a passive and dynamic driving system. FIG. 8 is a diagram showing the schematic circuit structure thereof, and FIG. 9 is a schematic cross-sectional view thereof.

Figure 9:
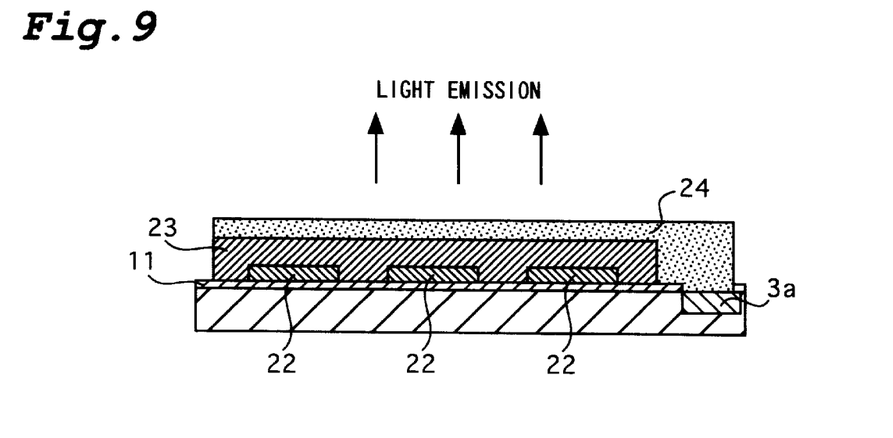
FIG. 9 is a schematic cross-sectional view showing the second embodiment of the present invention.

As shown in FIGS. 8 and 9, also in the present embodiment, a monocrystalline silicon semiconductor substrate is used as a substrate 1, and a pixel array 2 composed of an organic EL device and a peripheral driving integrated circuit 3a are formed on the substrate 1 as in above-mentioned first embodiment.

The peripheral driving integrated circuit 3a comprises a Y driver 31a for feeding a scanning signal for displaying an image signal or the like on a screen to row selecting lines 4, an X electrode driver 33a for feeding a data signal to data lines 5, and a buffer memory 32a for holding video input signal data corresponding to one line in accordance with a clock signal from the X electrode driver 33a.

As described in the foregoing, the substrate 1 is a monocrystalline silicone semiconductor substrate, and the Y driver 31a, the X electrode driver 33a, and the buffer memory 32a are formed in the substrate 1 in the periphery of the pixel array 2 by a known CMOS process.

In the pixel array 2 in the semiconductor substrate 1, the row selecting lines 4 to which the horizontal scanning signal fed from the Y driver 31a is inputted are arranged parallel to each other through an insulating film on the substrate 1. The data lines 5 are arranged parallel to each other in a direction perpendicular to the row selecting lines 4. In the present embodiment, the organic EL display device is driven by a passive and dynamic driving system, so that the organic EL device is provided between the data line 5 and the row selecting line 4. A cathode 22 is used as the row selecting line 4 in the pixel array 2, and an anode 24 is used as the data line 5. That is, the cathodes 22 are arranged parallel to each other at the same pitch as the row selecting lines 4 from the Y driver 31a through the insulating film 11 on the substrate 1. An organic layer 23 is provided thereon, and the transparent electrodes 24 extending in a direction perpendicular to the cathodes 22 are arranged on the organic layer 23 at the same pitch as the data lines 5 from the X electrode driver 33a. As a result, the organic EL device is provided at the intersection of the row selecting line and the data line.

Also in the present embodiment as shown in FIG. 9, the cathodes 22 are arranged on the side of the semiconductor substrate 1, the organic layer 23, and the transparent electrodes 24, composed of ITO, $SnO_2$, etc., serving as the anodes are arranged thereon, so that the organic EL device emits light from its surface opposite to the substrate 1, as in the above-mentioned first embodiment. Also in the present embodiment, the organic EL device emits light from its surface opposite to the substrate 1. Also in the present embodiment, therefore, a light transmitting portion need not be formed by etching, for example, the substrate 1, the number of steps is not increased, and the mechanical strength may not be decreased.

The organic EL device according to the present invention is constructed, similarly to the above-mentioned organic EL device. That is, an insulating film 11 is formed on the silicon semiconductor substrate 1, and an electron injection electrode 22 (2000 Å in thickness) serving as the cathode, the organic layer 23 composed of an electron transporting layer (500 Å in thickness), a light emitting layer (200 Å in thickness)and a hole transporting layer (500 Å in thickness), and a hole injection electrode 24, composed of an indium-tin oxide (ITO), serving as the anode are formed in this order on the insulating film 11. As described above, a deposited organic EL device is sealed using a sealing material and shield glass.

Also in the present embodiment, the cathode 22 which is easily oxidized is provided on the substrate 1, and the organic layer 23 and the anode (the transparent electrode) 24 are arranged thereon. Therefore, the cathodes 22 can be prevented from being oxidized, even if no antioxidant film is provided, by sealing the organic EL device using a sealing material and shield glass.

Description is now made of an example of a method of fabricating the organic EL device having the structure shown in FIGS. 7 to 9.

A peripheral driving integrated circuit 3a is first formed on a semiconductor substrate 1 using a normal MOS-LSI process technique. After the process, an organic EL device is formed in an organic EL pixel array 2.

Cathodes 22 of the organic EL device are first formed on an insulating film 11 on the semiconductor substrate 1. The cathodes 22 are formed, using a metal mask, parallel to each other at the same pitch as row selecting lines in a predetermined pixel area on the semiconductor substrate 1 by resistance heating type vacuum evaporation. A material having a low work function, for example, MgIn, MgAg, or AlLi is used as a material for the cathodes 22. Further, the pattern of the cathodes 22 is formed such that a common electrode line 6 and each of the cathodes 22 are electrically connected to each other.

Thereafter, an organic electron transporting layer, an organic light emitting layer, and an organic hole transporting layer are successively formed in this order similarly using vacuum evaporation on the entire surface of the substrate 1, including the cathodes 22, by masking the driving integrated circuit 3a. That is, $BeBq_2$ is vacuum-evaporated over the cathodes 22, to form the electron transporting layer, and αNPD and rubrene are evaporated over the electron transporting layer, to form the light emitting layer, after which MTDATA is vacuum-evaporated over the light emitting layer, to form the hole transporting layer. The evaporation is performed under conditions that the degree of vacuum is $1 \times 10^{-6}$ Torr and the substrate temperature is not controlled.

Transparent electrodes 24, composed of ITO, serving as anodes are formed in a predetermined pattern on an organic layer 23 by sputtering using a metal mask. The transparent electrodes 24 are patterned parallel to each other at the same pitch as the data lines in a direction perpendicular to the cathodes 22, so that the transparent electrode 24 and the X driver 33a are electrically connected to each other.

Thereafter, a protective film is formed on the entire surface of the organic EL pixel array 2 and the driving integrated circuit 3a. Examples of a material for the protective film include a polymeric material (SiO), and metal oxides such as $SiO_2$ and MgO. After the protective film is formed, a display panel is sealed by shield glass and a sealing material, thereby obtaining a device in which the driving integrated circuit 3a and the organic EL pixel array 2 are integrated.

Although in the above-mentioned first and second embodiments, the monocrystalline silicon substrate is used as the semiconductor substrate, a polycrystalline silicon semiconductor layer formed on a glass substrate by a low-temperature process can be also used as a base substrate. A third embodiment of the present invention using as a base substrate a polycrystalline silicon semiconductor layer provided on a glass substrate will be described in FIGS. 10 and 11.

Figure 10:
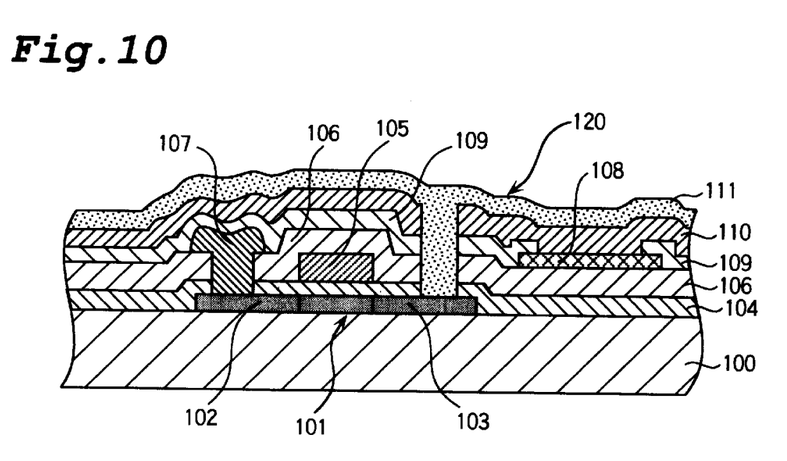
FIG. 10 is a schematic cross-sectional view showing a third embodiment of the present invention.
Figure 11:
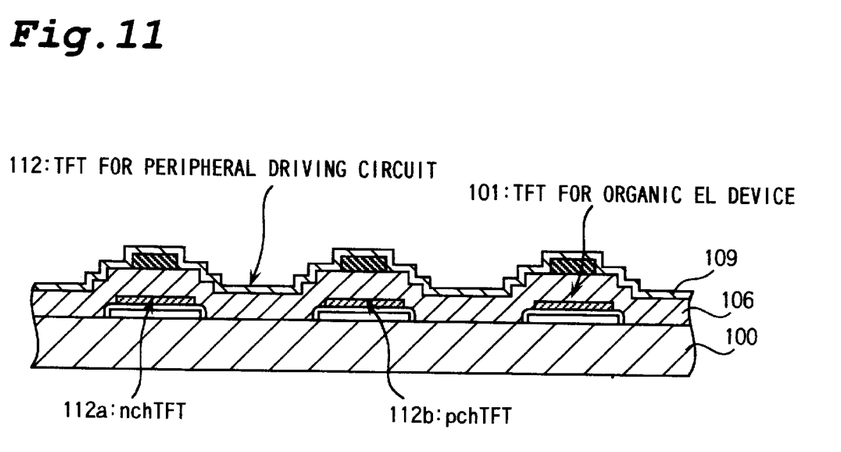
FIG. 11 is a schematic cross-sectional view showing the third embodiment of the present invention.

In the present embodiment, an island composed of a polycrystalline silicon semiconductor is formed on a glass substrate 100 by a low-temperature process, and a pixel array composed of an organic EL device and a peripheral driving integrated circuit are formed on the substrate 100.

As shown in FIG. 11, a peripheral driving integrated circuit 112 is constituted by a driver, a register, or the like for displaying an image signal or the like on a screen, and comprises an n channel thin film transistor (TFT) 112a and a p-channel thin film transistor 112b.

In the pixel array in the glass substrate 100, row selecting lines to which a horizontal scanning signal from a driver circuit is inputted are arranged parallel to each other on the substrate 100, which is not illustrated. Data lines to which a data signal is fed are arranged on the substrate 100 similarly through an insulating film. Further, common electrode lines are arranged parallel to each other through the insulating film on the substrate 100. As in the above-mentioned first embodiment, a portion enclosed by the row selecting line, the data line, and the common electrode line is an organic EL device 120 corresponding to one pixel.

The organic EL device 120 is provided with switching means for turning the organic EL device on and off. The switching means is constituted by a TFT 101 formed using a polycrystalline silicon island provided on the glass substrate 100. The organic EL device 120 is constituted by an active matrix four-terminal TFT-EL device, similarly to the above-mentioned organic EL device 20 shown in FIG. 3, and comprises two TFTs, a capacitor and an EL device.

The polycrystalline silicon semiconductor is formed by a low-temperature process for melting and recrystallizing an amorphous silicon film formed by reduced pressure CVD on the glass substrate 100 using laser annealing. The laser annealing is performed upon irradiating the surface of the amorphous silicon film with a laser beam and scanning the amorphous silicon film using a laser much of which is absorbed by a silicon film, for example, a KrF excimer laser having a wavelength λ=248 nm or an XeCl laser having a wavelength λ=308 nm. In order to use the polycrystalline silicon film formed on the glass substrate 100 as an active layer of the TFT, the polycrystalline silicon film is patterned by a photolithographic technique and a dry etching technique using RIE, to form a desired polycrystalline silicon island. Thereafter, a silicon oxide film to be a gate insulating film 104 is provided on the polycrystalline silicon island by reduced pressure CVD. A gate electrode 105 composed of tungsten silicide is formed on the gate insulating film 104. Impurities are injected into the polycrystalline silicon film using the gate electrode 105 as a mask by a self-aligning technique, to form a source region 102 and a drain region 103. Both the regions are activated by RTA (Rapid Thermal Annealing) or the like. An interlayer insulating film 106 composed of a silicon oxide film is formed on the TFT 101 by CVD.

FIG. 10 is a cross-sectional view of a second TFT corresponding to the Tr2 shown in FIG. 3.

A first TFT has its gate electrode connected to the row selecting line, and has its drain region connected to the data line, which is not illustrated. The first TFT has its source region connected to the common electrode line through a capacitor (C).

Furthermore, the second TFT has its gate electrode 105 connected to the source region of the first TFT by aluminum wiring 107, and has its source region 102 connected to the common electrode line by the aluminum wiring 107. The second TFT has its drain region 103 connected to one of pixel electrodes, that is, an anode (a transparent electrode) 111 in the present embodiment, and the other pixel electrode (a cathode) 108 is connected to the common electrode line. The first and second TFTs and the capacitor (C) are provided for each pixel.

In the present embodiment, as shown in FIG. 10, the cathode 108 is arranged on the side of the glass substrate 100, and a passivation film 109, an organic layer 110, a transparent electrode 111, composed of ITO, $SnO_2$, etc., serving as the anode are arranged thereon, so that the organic EL device emits light from its surface opposite to the glass substrate 100. That is, in the present embodiment, the organic EL device emits light from its surface opposite to the substrate 100.

Description is now made of the organic EL device. In the organic EL device according to the present invention, an electron injection electrode 108 (2000 Å in thickness) serving as the cathode, an electron transporting layer (500 Å in thickness), a light emitting layer (200 Å in thickness), a hole transporting layer (500 Å in thickness), and a hole injection electrode 111, composed of an indium-tin oxide (ITO), serving as the anode are formed in this order on an interlayer insulating film 106 provided on the glass substrate 100. As described above, a deposited organic EL device is sealed using a sealing material and shield glass.

The above-mentioned electron injection electrode (the cathode) 108 uses a metal having a small work function, for example, MgIn, MgAg, or AlLi. However, the cathode 108 easily reacts with oxygen or water in air because it has a small work function. If the cathode is arranged on the uppermost layer of the organic EL device, therefore, an antioxidant film for preventing the cathode from being oxidized is required. On the other hand, in the present invention, the cathode 108 which is easily oxidized is provided on the glass substrate 100, and the organic layer 110 and the anode (the transparent electrode) 111 are arranged thereon. Therefore, the cathode 108 can be prevented from being oxidized even if no special antioxidant film is provided by sealing the organic EL device using a sealing material and shield glass.

A polycrystalline silicon TFT for the peripheral driving integrated circuit is also formed on the same glass substrate 100 in the same fabricating method as the above-mentioned TFT for the organic EL device. Further, the polycrystalline silicon TFT for the peripheral driving integrated circuit is formed into a CMOS structure, so that the dimensions as each driver can be reduced.

Although in the above-mentioned third embodiment, description was made of the organic EL display device in an active and static driving system, a driving circuit integrated type display device can be constructed using a glass substrate and a polycrystalline silicon semiconductor provided thereon in an organic EL display device in a passive and dynamic driving system as in the second embodiment.

Since in the above-mentioned embodiments, the organic EL display device is so constructed that the organic EL device emits light from its surface opposite to the glass substrate 100, a substrate other than a transparent substrate can be also used as the substrate. When the transparent substrate is used, it can be so constructed that the organic EL device emits light from its surface on the side of the glass substrate, provided that the order in which the constituent elements of the organic EL device are arranged is reversed.

The organic EL display device according to the present invention is suitably used for a direct view type display device, it can be also used as a light valve of a projector.

As described in the foregoing, according to the present invention, the pixel array comprising the organic EL device and the peripheral driving integrated circuit can be produced on the same substrate, so that the organic EL display array is easy to fabricate, and can be miniaturized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent display device, wherein
    a pixel array composed of an organic electroluminescent device is provided on a semiconductor base substrate, a driving integrated circuit for driving said organic electroluminescent device is formed in the periphery of the pixel array on said semiconductor base substrate, and a cathode, an organic layer and an anode are laminated in this order on said semiconductor base substrate, so that the organic electroluminescent device emits light from its surface on the opposite side of said base substrate.

2. The organic electroluminescent display device according to claim 1, wherein
    said semiconductor base substrate is composed of a monocrystalline silicon semiconductor.

3. The organic electroluminescent display device according to claim 1, wherein
    said semiconductor base substrate has an island composed of a polycrystalline silicon semiconductor provided on its insulating substrate.

4. The organic electroluminescent display device according to claim 1, wherein
    one of pixels constituting said pixel array comprises two transistors, a capacitor, and an organic electroluminescent device.

5. The organic electroluminescent display device according to claim 1, wherein
    said organic electroluminescent device is passively and dynamically driven.

6. An organic electroluminescent display device, wherein
    a pixel array composed of an organic electroluminescent device is provided on an insulating substrate, an island having a polycrystalline silicon semiconductor formed thereon in a predetermined pattern is provided on said substrate, and a thin film transistor formed in the island is used as a pixel driving device and a peripheral driving circuit device.

7. The organic electroluminescent display device according to claim 6, wherein
    a cathode, an organic layer, and an anode are laminated in this order on said substrate, so that the organic electroluminescent device emits light from its surface on the opposite side of said substrate.

8. The organic electroluminescent display device according to claim 6, wherein
    said substrate is a transparent substrate.

9. The organic electroluminescent display device according to claim 8, wherein
    a cathode, an organic layer, and an anode are laminated in this order on said substrate, so that the organic electroluminescent device emits light from its surface on the side of said substrate.

* * * * *